US012798905B2

(12) United States Patent
Katsuura et al.

(10) Patent No.: US 12,798,905 B2
(45) Date of Patent: Nov. 17, 2026

(54) TRANSPORT SYSTEM, FILM FORMING APPARATUS, AND ARTICLE MANUFACTURING METHOD

(71) Applicant: CANON KABUSHIKI KAISHA, Tokyo (JP)

(72) Inventors: Kosuke Katsuura, Kanagawa (JP); Takeshi Yamamoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/323,265

(22) Filed: May 24, 2023

(65) Prior Publication Data

US 2023/0382662 A1 Nov. 30, 2023

(30) Foreign Application Priority Data

May 27, 2022 (JP) ................................ 2022-087223

(51) Int. Cl.
*B65G 54/02* (2006.01)
*C23C 16/04* (2006.01)
*C23C 16/54* (2006.01)
*H02K 41/03* (2006.01)

(52) U.S. Cl.
CPC ............ *B65G 54/02* (2013.01); *C23C 16/042* (2013.01); *C23C 16/54* (2013.01); *H02K 41/031* (2013.01)

(58) Field of Classification Search
CPC ....... B65G 54/02; C23C 16/042; C23C 16/54; H02K 41/031
USPC .......................................................... 118/729
See application file for complete search history.

(56) References Cited

U.S. PATENT DOCUMENTS

| | | | | | |
|---|---|---|---|---|---|
| 5,156,093 | A * | 10/1992 | Azukizawa | B65G 54/02 104/282 |
| 5,647,477 | A | 7/1997 | Morishita | |
| 11,374,479 | B2 * | 6/2022 | Yamamoto | H02K 41/031 |
| 11,777,388 | B2 * | 10/2023 | Yamamoto | H02P 25/064 318/135 |
| 11,851,274 | B2 * | 12/2023 | Yamamoto | B65G 49/06 |
| 12,015,319 | B2 * | 6/2024 | Yamamoto | B65G 43/08 |

(Continued)

FOREIGN PATENT DOCUMENTS

| | | |
|---|---|---|
| JP | H06205576 A | 7/1994 |
| JP | H06101884 B2 | 12/1994 |

(Continued)

*Primary Examiner* — Charlee J. C. Bennett
(74) *Attorney, Agent, or Firm* — Canon U.S.A., Inc. IP Division

(57) ABSTRACT

A transport system includes a first member including a top face and a plurality of magnets arranged on the top face along a first direction, a second member including a plurality of coils arranged along the first direction to face to the plurality of magnets and movable in the first direction relative to the first member, and a control unit that moves one of the first member and the second member in the first direction while a gravitational force acts on the one of the first and second member and the one of the first member and the second member is floating in a second direction crossing the first direction at a height position higher than an equilibrium position where magnetic attraction force acting between the plurality of magnets and the plurality of coils balances with the gravitational force acting on the one of the first and second member.

11 Claims, 15 Drawing Sheets

(56) References Cited

U.S. PATENT DOCUMENTS

| | | | | |
|---|---|---|---|---|
| 12,139,352 | B2 * | 11/2024 | Yamamoto | B60L 13/10 |
| 12,301,144 | B2 * | 5/2025 | Kimura | H01L 21/67709 |
| 2017/0276138 | A1 * | 9/2017 | Han | F04D 29/4293 |
| 2021/0188569 | A1 * | 6/2021 | Yamamoto | B65G 54/02 |
| 2021/0245974 | A1 * | 8/2021 | Hashizume | B65G 54/02 |

FOREIGN PATENT DOCUMENTS

| | | | | | |
|---|---|---|---|---|---|
| JP | 2608125 | B2 | | 5/1997 | |
| JP | 3083199 | B2 | | 9/2000 | |
| JP | 3376155 | B2 | | 2/2003 | |
| JP | 2003087910 | A | | 3/2003 | |
| JP | 2021125979 | A | | 8/2021 | |
| KR | 101386685 | B1 | * | 4/2014 | B65G 49/061 |

* cited by examiner

TRANSPORT SYSTEM, FILM FORMING APPARATUS, AND ARTICLE MANUFACTURING METHOD

BACKGROUND

Field

The present disclosure relates to a transport system, a film forming apparatus, and a method of manufacturing an article.

Description of the Related Art

Japanese Examined Patent Publication No. H06-101884 discloses a floating type transport apparatus using a magnetic support system. The floating type transport apparatus disclosed in Japanese Examined Patent Publication No. H06-101884 includes an electromagnet arranged to face a guide rail via a gap, and a permanent magnet interposed in a magnetic circuit composed of the electromagnet, the guide rail and the gap and mounted on a transport vehicle. The permanent magnet forms a magnetic support unit together with the magnetic circuit.

In general, in a floating type transport apparatus using a magnetic support system, zero power control for controlling a coil current value to converge to near zero is known in order to reduce power consumption during floating transport. The floating transport apparatus disclosed in Japanese Examined Patent Publication No. H06-101884 includes a gap sensor that detects a predetermined gap length between the guide rail and the magnetic support unit, and controls the current of the electromagnet to maintain the gap length so that the weight of the transport object and the attraction force by the permanent magnet are exactly matched. That is, in Japanese Examined Patent Publication No. H06-101884, the above gap length is set so that the excitation current of the electromagnet becomes zero and the transport vehicle is floated and transported.

However, in the zero power control disclosed in Japanese Examined Patent Publication No. H06-101884, when the power of the apparatus is cut off due to some abnormality, it is not possible to specify whether the transport vehicle, as a mover, sticks to the upper side or falls to the lower side. That is, in the zero power control disclosed in Japanese Examined Patent Publication No. H06-101884, when the power of the apparatus is cut off, the mover may fall. The falling of the mover may cause damage to the mover or the member or the like with which the fallen mover collided.

SUMMARY

An aspect of the present disclosure is to provide a transport system that can prevent a mover from falling even when the power is cut off during floating of the mover.

According to one aspect of the present disclosure, there is provided a transport system including: a first member including a top face and a plurality of magnets arranged on the top face along a first direction, a second member including a plurality of coils arranged along the first direction to face to the plurality of magnets and movable in the first direction relative to the first member, and a control unit that moves one of the first member and the second member in the first direction while a gravitational force acts on the one of the first and second member and the one of the first member and the second member is floating in a second direction crossing the first direction at a height position higher than an equilibrium position where magnetic attraction force acting between the plurality of magnets and the plurality of coils balances with the gravitational force acting on the one of the first member and the second member.

According to another aspect of the present disclosure, there is provided a transport system including: a first member including a top face and a plurality of magnets arranged on the top face along a first direction; a second member including a plurality of coils arranged along the first direction to face to the plurality of magnets and movable in the first direction relative to the first member, wherein a magnetic attraction force acts between the plurality of coils and the plurality of magnets; and a control unit that determines a height position of one of the first member and the second member based on a cogging torque, and moves the one of the first member and the second member in the first direction, wherein the height position was determined while the one of the first member and the second member is floating in a second direction crossing the first direction at the height position.

Further features of the present disclosure will become apparent from the following description of exemplary embodiments with reference to the attached drawings.

DESCRIPTION OF THE EMBODIMENTS

First Embodiment

A first embodiment of the present disclosure will be described below with reference to FIG. 1 to FIG. 12.

Figure 1:
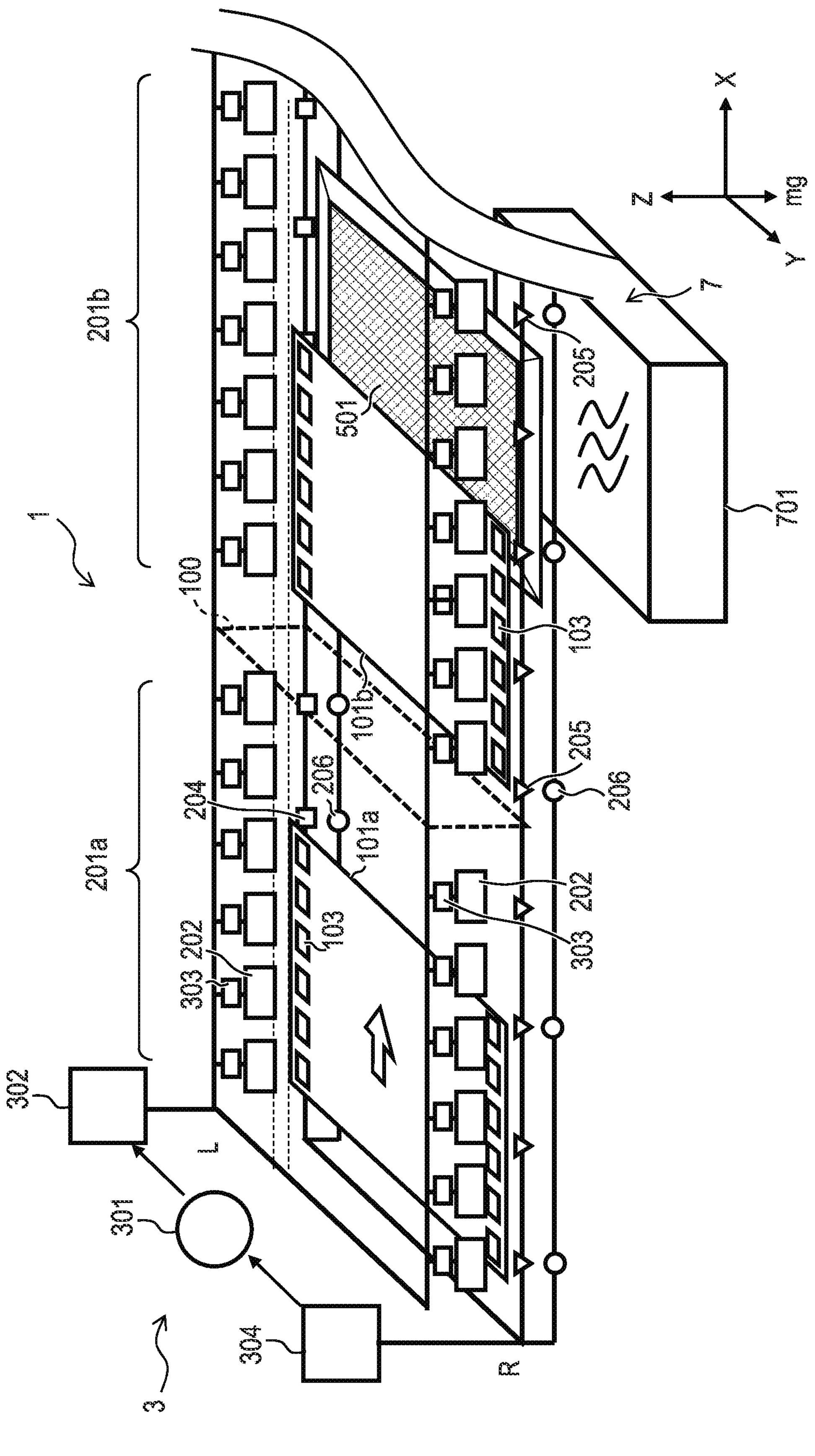
FIG. 1 is a schematic diagram illustrating a configuration of a transport system according to a first embodiment of the present disclosure.
Figure 2:
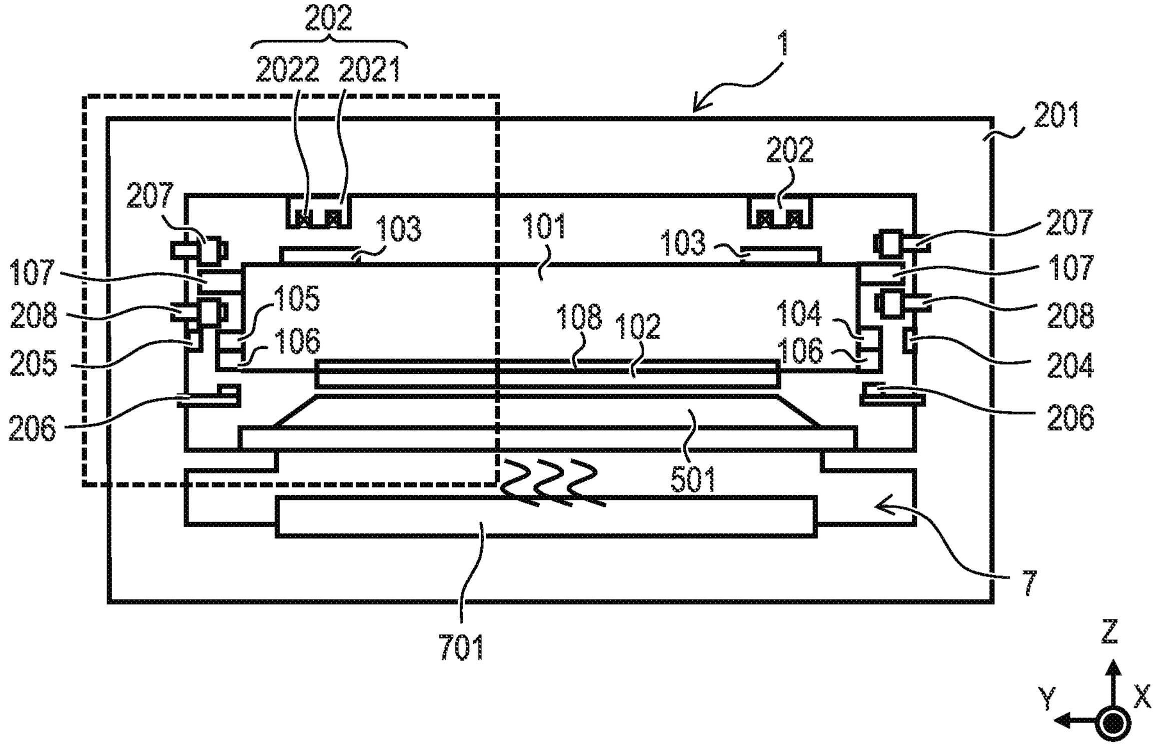
FIG. 2 is a schematic diagram illustrating a configuration of the transport system according to the first embodiment.
Figure 3:
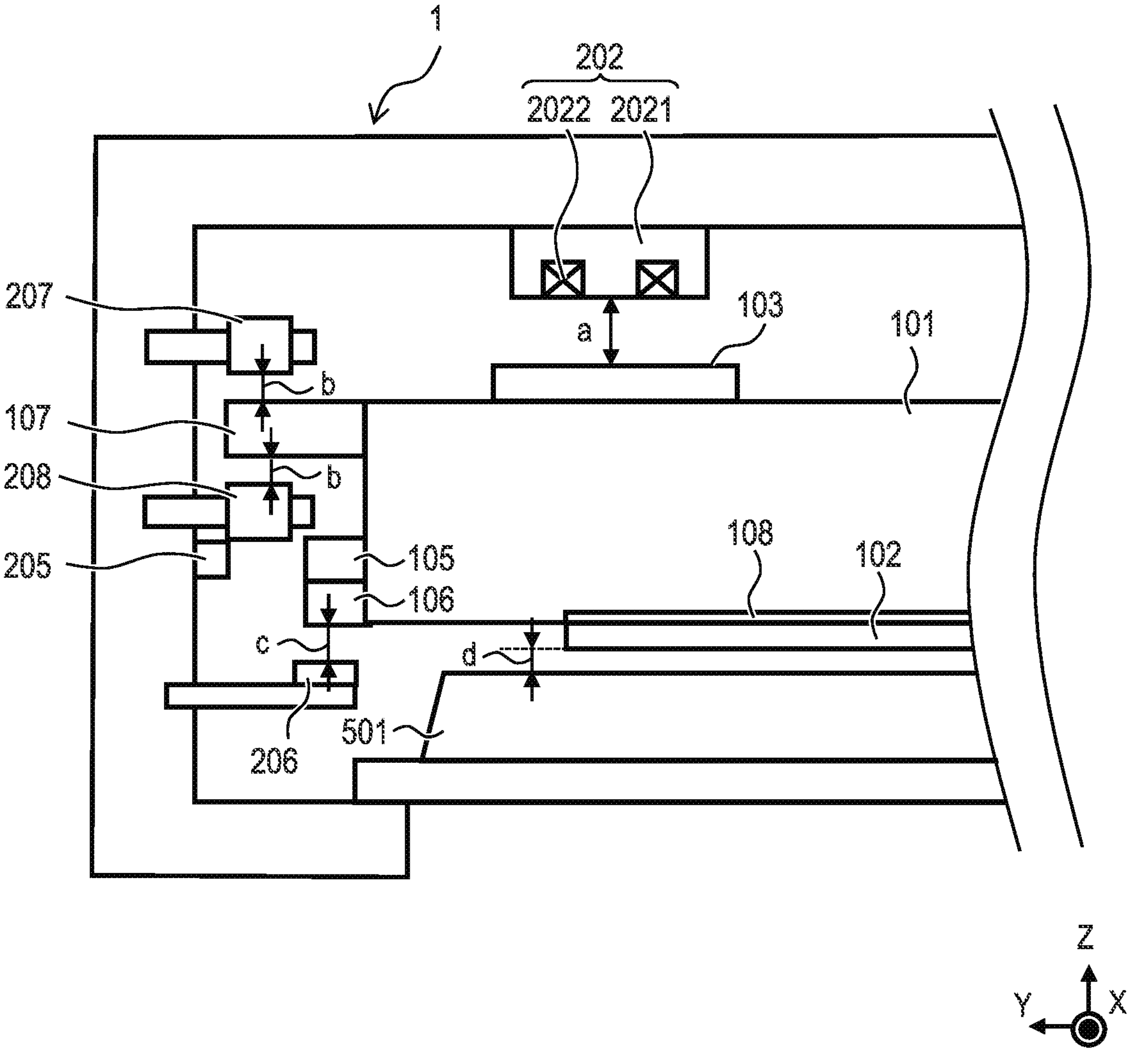
FIG. 3 is a schematic diagram illustrating a configuration of the transport system according to the first embodiment.
Figure 4:
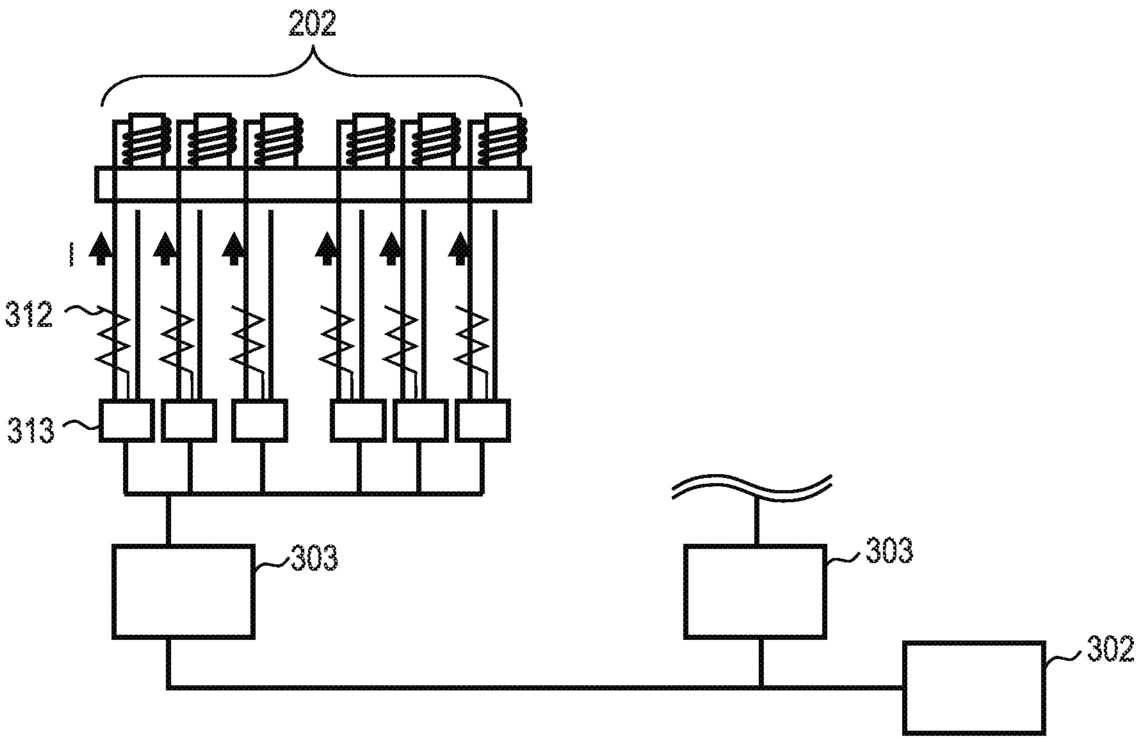
FIG. 4 is a schematic diagram illustrating coils and a coil related configuration in the transport system according to the first embodiment.

First, a configuration of a transport system 1 according to the present embodiment will be described with reference to FIG. 1 to FIG. 4. FIG. 1 to FIG. 3 are schematic diagrams illustrating the configuration of the transport system 1 including movers 101 (as first members) and stators 201 (as second members) according to the present embodiment. Note that FIG. 1 and FIG. 2 are views of extracted main portions of each mover 101 and each stator 201, respectively. Further, FIG. 1 is a diagram of the mover 101 when viewed from a diagonally upper side, and FIG. 2 is a diagram of the mover 101 and the stator 201 when viewed from the X direction described later. FIG. 3 is an enlarged diagram illustrating a rectangular portion surrounded by a broken line in FIG. 2. FIG. 4 is a schematic diagram illustrating coils 202 and a coil related configuration in the transport system 1.

As illustrated in FIG. 1 and FIG. 2, the transport system 1 according to the present embodiment has the mover 101 forming a carrier, a carriage or a slider, and the stator 201 forming a transport path. Further, the transport system 1 has an integration controller 301, a coil controller 302, coil unit controllers 303, and a sensor controller 304. Note that FIG. 1 illustrates two movers 101*a* and 101*b* as the mover 101 and two stators 201*a* and 201*b* as the stator 201. In the following description, a reference including only the numeral common to others is used when it is not particularly required to distinguish components that may be present as multiple components, such as the mover 101 and the stator 201, and a lowercase alphabet is appended to a numeral reference to distinguish the individuals if necessary.

The transport system 1 according to the present embodiment is a transport system using a linear motor that transports the mover 101 by generating electromagnetic force between the coil 202 of the stator 201 and the permanent magnet 103 of the mover 101. Further, the transport system 1 according to the present embodiment is a magnetic floating type transport system that causes the mover 101 to float and transports the mover 101 in a contactless manner.

The transport system 1 according to the present embodiment constitutes a part of a processing system also including a process apparatus that performs a processing operation on a workpiece transported by the mover 101. In general, a transport system is used in a production line used for assembling industry products, a semiconductor exposure apparatus, or the like. In particular, a transport system in a production line transports workpieces such as components between a plurality of stations within a factory-automated production line or between factory-automated production lines. Further, such a transport system may be used as a transport system within a process apparatus. The transport system 1 according to the present embodiment can be used for such applications.

The transport system 1 transports the workpiece 102 held by the mover 101 to a process apparatus that performs a processing operation on the workpiece 102 by transporting the mover 101 by the stator 201, for example. The process apparatus is not particularly limited and may be, for example, a film forming apparatus such as a vapor deposition apparatus, a sputtering apparatus, or the like to form a film on a glass substrate that is the workpiece 102. Note that, although FIG. 1 illustrates two movers 101 for two stators 201, the number is not limited thereto. In the transport system 1, one or a plurality of movers 101 may be transported on one or a plurality of stators 201.

Herein, coordinate axes, directions, and the like used in the following description are defined. First, an X-axis is taken along a horizontal direction that is the transport direction of the mover 101, and the transport direction of the mover 101 is defined as an X direction. Further, a Z-axis is taken along a perpendicular direction that is a direction orthogonal to the X direction, and the perpendicular direction is defined as a Z direction. The perpendicular direction corresponds to a direction of gravity (mg direction). Further, a Y-axis is taken along a direction orthogonal to the X direction and the Z direction, and a direction orthogonal to the X direction and the Z direction is defined as a Y direction. Furthermore, a rotation direction around the X-axis is defined as a Wx direction, a rotation direction around the Y-axis is defined as a Wy direction, and a rotation direction around the Z-axis is defined as a Wz direction. Further, "*" is used as a multiplication symbol. Further, the center of the mover 101 is defined as origin Oc, the +Y side is denoted as R side, and the —Y side is denoted as L side. Note that, although the transport direction of the mover 101 is not necessarily required to be a horizontal direction, the Y direction and the Z direction can be similarly defined also in such a case with the transport direction being defined as the X direction. Note that the X direction, the Y direction, and the Z direction are not necessarily limited to directions orthogonal to each other and can be defined as directions crossing each other.

As illustrated by an arrow in FIG. 1, the mover 101 is configured to be movable in the X direction, which is the transport direction. The mover 101 has permanent magnets 103, a linear scale 104, a Y target 105, Z targets 106, and stoppers 107. The mover 101 has a top face and a bottom face positioned on the opposite side of the top face.

A plurality of permanent magnets 103 are attached and installed along the X direction on the top face of the mover 101 at respective ends on the R side and the L side. The plurality of permanent magnets 103 constituting the group of magnets on the R side and the L side are arranged so that the N poles and the S poles are alternately arranged, with the polarities of the surfaces facing the Z direction adjacent to each other in the X direction being different from each other. Note that the location and the number of permanent magnets 103 are not limited to the case illustrated in FIG. 1 and FIG. 2, and may be appropriately changed.

The linear scale 104, the Y target 105, and the Z target 106 are attached and installed on the mover 101 at positions that can be read by a linear encoder 204, a Y-sensor 205, and a Z-sensor 206 installed on the stator 201, respectively.

The stoppers 107 are attached and installed so as to project outward in the Y direction from both side faces of the mover 101 facing the Y direction. Collision prevention rollers 207 and 208 described later are disposed with respect to the stopper 107 so as to face the stopper 107 from the upper and lower sides in the Z direction.

The stator 201 has the coils 202, the linear encoder 204, the Y-sensor 205, the Z-sensor 206, and collision prevention rollers 207 and 208.

A plurality of coils 202 are attached and installed along the X direction to the stator 201 so as to be able to face, along the Z direction, to the permanent magnet 103 installed on the top face of the mover 101. Specifically, the plurality of coils 202 are arranged and installed in two lines along the X direction so as to face, from the top in the Z direction, the two lines of the permanent magnets 103 installed at the respective ends on the R side and the L side on the top face of the mover 101. Note that the installation places and the number of the coils 202 are not limited to the case illustrated in FIG. 1 and FIG. 2, and may be changed as appropriate. The coil 202 has a core 2021 such as an iron core or the like and a winding 2022 wound around the core 2021.

The stator 201 generates electromagnetic force between the coils 202 and the permanent magnets 103 by each coil 202 to which a current is applied. Thus, the mover 101 moves along the X direction while floating along the Z direction.

The linear encoder 204, the Y-sensor 205, and the Z-sensor 206 function as detection units that detect the position and attitude of the mover 101 moving along the transport direction.

The linear encoder 204 is attached and installed on the stator 201 so as to be able to read the linear scale 104 installed on the mover 101. The linear encoder 204 detects the relative position to the linear encoder 204 of the mover 101 relative to the linear encoder 204 by reading the linear scale 104.

The Y-sensor 205 is attached and installed on the stator 201 so as to be able to detect the distance in the Y direction to the Y-target 105 installed on the mover 101. The Z-sensor 206 is attached and installed on the stator 201 so as to be able to detect the distance in the Z direction to the Z-target 106 installed on the mover 101.

The collision prevention rollers 207 and 208 are attached and installed on the stator 201 along the X direction so as to face each stopper 107 of the mover 101 from the upper and lower sides in the Z direction. The collision prevention roller 207 is installed so as to face the stopper 107 from the upper side. The collision prevention roller 208 is installed so as to face the stopper 107 from the lower side. The collision prevention rollers 207 and 208 are brought into contact with the stopper 107 according to the position in the Z direction of the mover 101 to restrict the movable range of the mover 101 in the Z direction. Each of the collision prevention rollers 207 and 208 are rotatably configured so that the stopper 107 rolls in the X direction when the stopper 107 comes into contact with it.

The mover 101 is configured to be transported with the workpiece 102 attached or held above or under the mover 101, for example. Note that FIG. 2 and FIG. 3 illustrate a state where the glass substrate 102 as the workpiece is held by a holding mechanism 108 provided on the bottom face of the mover 101. Note that the mechanism used for attaching or holding the workpiece to the mover 101 is not particularly limited, and a general attaching mechanism, a general holding mechanism, or the like such as a mechanical hook, an electrostatic chuck, or the like may be used.

FIG. 1 and FIG. 2 illustrate a vapor deposition apparatus 7 that performs vapor deposition on the glass substrate 102, which is a substrate held by the mover 101, as an example of the process apparatus that performs a processing operation on the workpiece held by the mover 101. The vapor deposition apparatus 7 is installed in the stator 201.

The deposition apparatus 7 has a pattern mask 501 installed so as to face the glass substrate 102 held under the mover 101, and a deposition source 701 installed under the pattern mask 501 so as to face the glass substrate 102 through the pattern mask 501. The vapor deposition source 701 is a film deposition source for forming a film on the glass substrate 102. When the mover 101 is transported in the X direction, the glass substrate 102 held by the mover 101 passes over the pattern mask 501. While the glass substrate 102 passes over the pattern mask 501, a vapor deposition material is emitted from the vapor deposition source 701 arranged below the pattern mask 501. The emitted vapor deposition material is deposited on the glass substrate 102 through the pattern mask 501. On the surface of the glass substrate 102 facing the deposition source 701, a thin film of the vapor deposited material such as a metal, an oxide, or the like is formed by vapor deposition with the deposition source 701. A pattern by the pattern mask 501 is formed on the thin film. Note that, during the vapor deposition, the mover 101 may be transported so that the glass substrate 102 passes over the pattern mask 501, or the mover 101 may also be stopped while floating so that the glass substrate 102 stops over the pattern mask 501. In this way, the workpiece is transported together with the mover 101, and the workpiece is processed by the process apparatus to manufacture an article from the workpiece.

Further, FIG. 1 illustrates an area including a place where a structure 100 such as a gate valve, for example, is present between the stator 201*a* and the stator 201*b*. The place where the structure 100 is present is a place that is located between a plurality of stations within a production line or between production lines and where continuous arrangement of electromagnets or coils is not possible.

FIG. 3 illustrates gaps (distances) a, b, c, and d in the Z direction between members in the transport system 1. The gap (a) is a gap between the coil 202 and the permanent magnet 103. The gap (b) is a gap between the collision prevention rollers 207 and 208 and the stopper 107, and is the sum of a gap between the upper collision prevention roller 207 and the stopper 107 and a gap between the lower collision prevention roller 208 and the stopper 107. The gap (c) is a gap between the Z sensor 206 and the Z target 106. The gap (d) is a gap between the glass substrate 102 and the pattern mask 501.

A relationship of $a \geq c > b > d$ is established between the sizes of the gaps. Therefore, the collision prevention roller 207 is brought into contact with the stopper 107 before the coil 202 comes into contact with the permanent magnet 103. Further, before the Z-sensor 206 comes into contact with the Z target 106, the collision prevention roller 208 comes into contact with the stopper 107. On the other hand, the gap (d) between the glass substrate 102 and the pattern mask 501 is designed to be ideally zero so as to be enormously narrow to enhance the performance of the vapor deposition.

A control system 3 that controls the transport system 1 is provided to the transport system 1. Note that the control system 3 may form a part of the transport system 1. The control system 3 has the integration controller 301, the coil controller 302, the coil unit controllers 303, and the sensor controller 304. The integration controller 301, the coil controller 302, the coil unit controller 303, and the sensor controller 304 execute their respective processes by executing control programs corresponding to their respective processes to perform various calculations. The coil controller 302 and the sensor controller 304 are connected to the integration controller 301 in a communicable manner. The plurality of coil unit controllers 303 are connected to the coil controller 302 in a communicable manner. The plurality of linear encoders 204, the plurality of Y-sensors 205, and the plurality of Z-sensors 206 are connected to the sensor controller 304 in a communicable manner. The coils 202 are connected to each coil unit controller 303.

The integration controller 301 determines current instruction values to be applied to the plurality of coils 202 based on the output from the linear encoder 204, the Y-sensor 205, and the Z-sensor 206 transmitted from the sensor controller 304. The integration controller 301 transmits the determined current instruction values to the coil controller 302. The coil controller 302 transmits the current instruction values received from the integration controller 301 to respective coil unit controllers 303. The coil unit controller 303 controls the current amounts of the connected coils 202 based on the current instruction values received from the coil controller 302.

As illustrated in FIG. 4, one or a plurality of coils 202 are connected to each coil unit controller 303.

A current sensor 312 and a current controller 313 are connected to the coil 202. The current sensor 312 detects the current value flowing in the connected coil 202. The current controller 313 controls the current amount flowing in the connected coil 202.

The coil unit controller 303 instructs the current controller 313 for a desired current amount based on the current instruction value received from the coil controller 302. The current controller 313 detects the current value detected by the current sensor 312 and controls the current amount so that current of a desired current amount flows in the coil 202.

Figure 5:
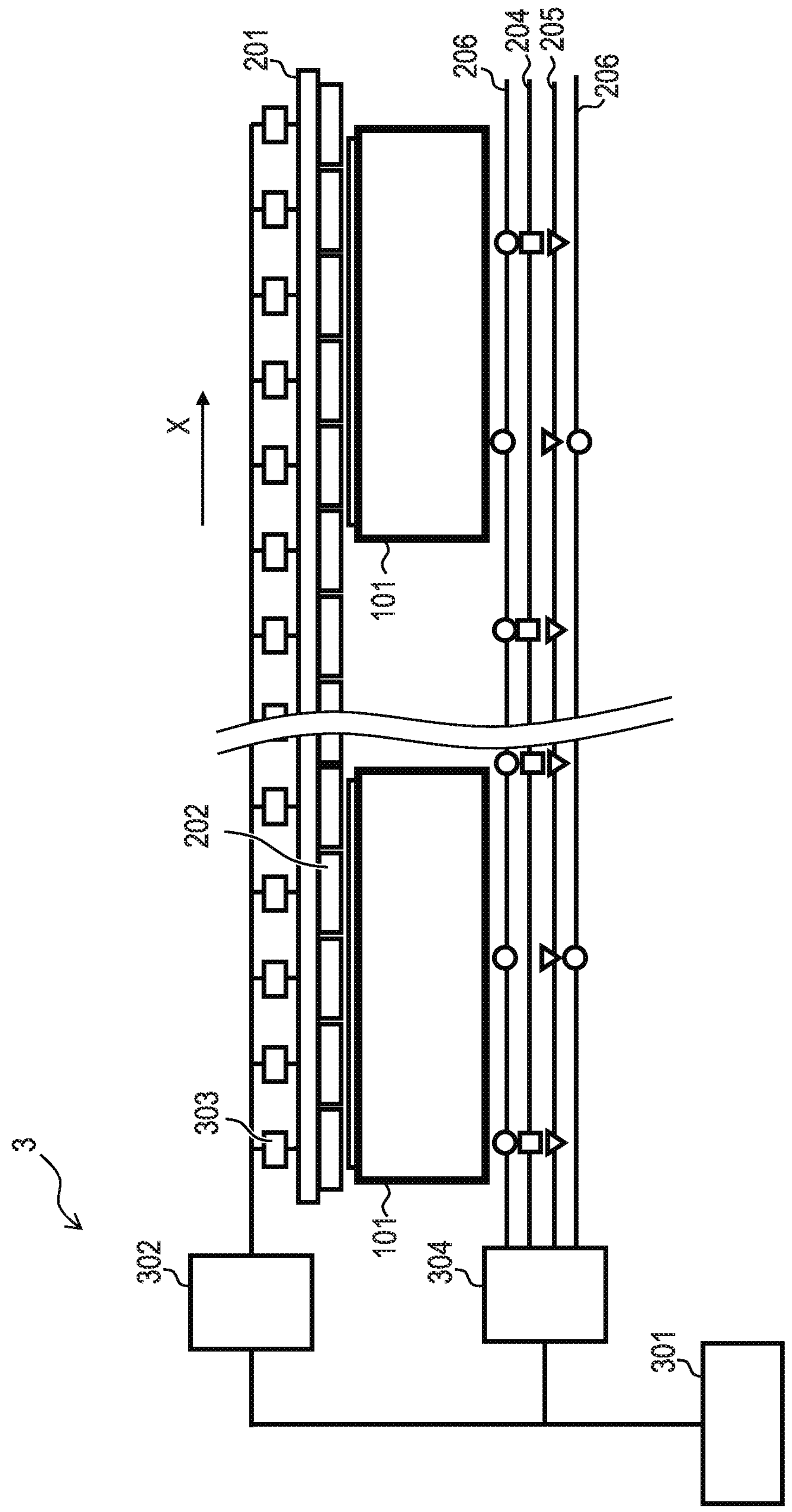
FIG. 5 is a schematic diagram illustrating a control system that controls the transport system according to the first embodiment.

Next, the control system 3 that controls the transport system 1 according to the present embodiment will be further described with reference to FIG. 5. FIG. 5 is a schematic diagram illustrating the control system 3 that controls the transport system 1 according to the present embodiment.

As illustrated in FIG. 5, the control system 3 has the integration controller 301, the coil controller 302, and the sensor controller 304. The control system 3 functions as a control unit that controls the transport system 1 including the mover 101 and the stator 201. The coil controller 302 and the sensor controller 304 are connected to the integration controller 301 in a communicable manner.

The plurality of coil unit controllers 303 are connected to the coil controller 302 in a communicable manner. The coil controller 302 and the plurality of coil unit controllers 303 connected thereto are provided in association with respective columns of coils 202. The coils 202 are connected to each coil unit controller 303.

The coil controller 302 can instruct target current values to each of the connected coil unit controllers 303. The coil unit controller 303 can control the current amount of each connected coils 202.

The plurality of linear encoders 204, the plurality of Y-sensors 205, and the plurality of Z-sensors 206 are connected to the sensor controller 304 in a communicable manner.

The plurality of linear encoders 204 are attached to the stator 201 at intervals such that one of the linear encoders 204 can always measure the position of one mover 101 even during transportation of the mover 101. Further, the plurality of Y-sensors 205 are attached to the stator 201 at intervals such that two of the Y-sensors 205 can always measure the Y-target 105 of one mover 101. Further, the plurality of Z-sensors 206 are attached to the stator 201 at intervals such that three of the two lines of Z-sensors 206 can always measure the Z-target 106 of one mover 101 and so as to form a plane.

The integration controller 301 determines current instruction values to be applied to the plurality of coils 202 based on the output from the linear encoders 204, the Y-sensors 205, and the Z-sensors 206 and transmits the current instruction values to the coil controller 302. The coil controller 302 instructs the coil unit controllers 303 for the current values based on the current instruction values from the integration controller 301 as described above. Accordingly, the integration controller 301 functions as a control unit to transport the mover 101 in a contactless manner along the stator 201 and control the attitude of the transported mover 101 in six axes.

Figure 6:
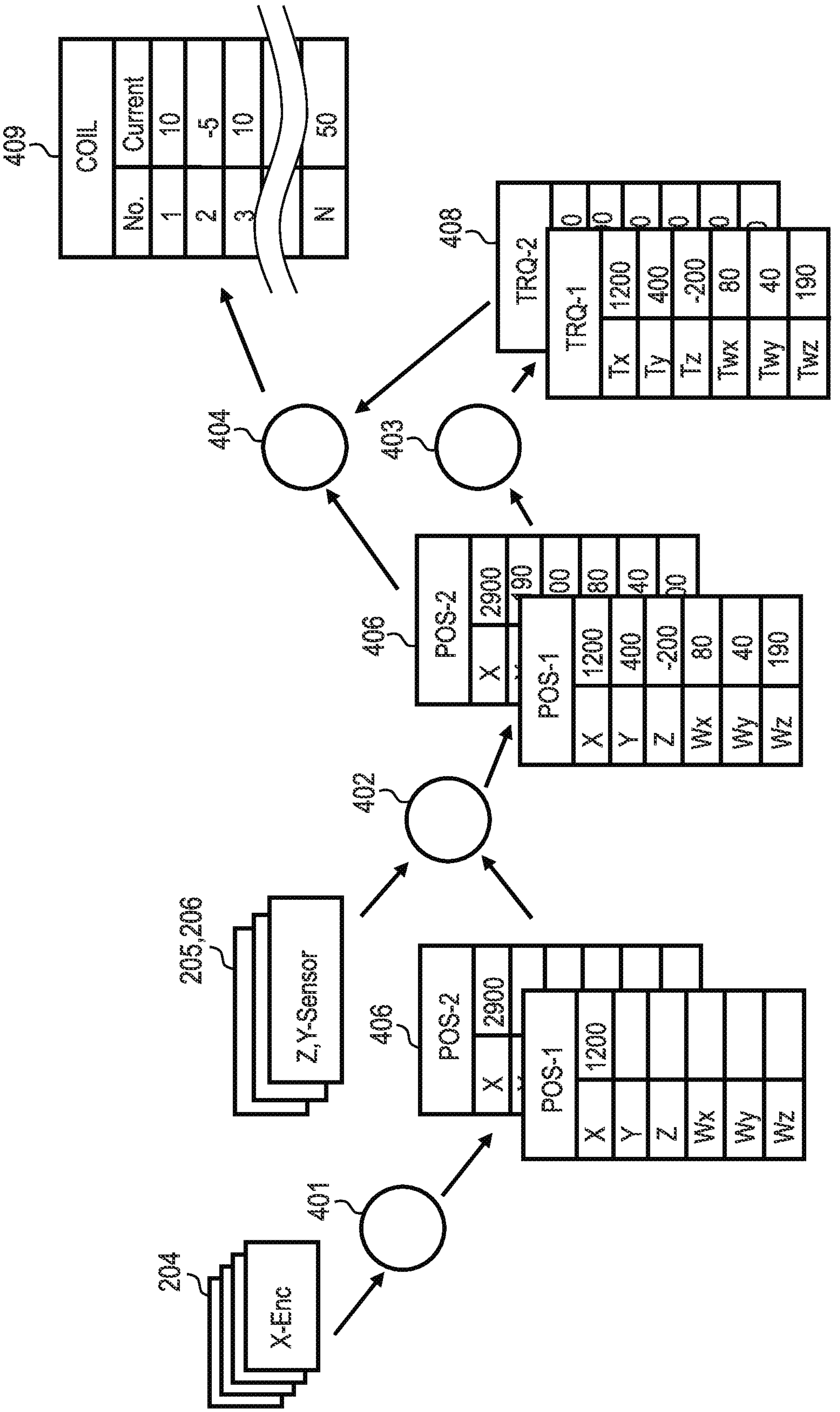
FIG. 6 is a schematic diagram illustrating an attitude control method of a mover in the transport system according to the first embodiment.

The integration controller 301 controls the current applied to the plurality of coils 202 based on the position and attitude of the mover 101 acquired by the linear encoder 204, the Y-sensor 205 and the Z-sensor 206. The attitude control method of the mover 101 performed by the integration controller 301 will be described below with reference to FIG. 6. FIG. 6 is a schematic diagram illustrating the attitude control method of the mover 101 in the transport system 1 according to the present embodiment. FIG. 6 illustrates the overview of the attitude control method of the mover 101 by mainly focusing on the data flow. The integration controller 301 functions as a control unit that performs a process using a mover position calculation function 401, a mover attitude calculation function 402, a mover attitude control function 403, and a coil current calculation function 404 as described below. Accordingly, the integration controller 301 controls the transportation of the mover 101 while controlling the attitude of the mover 101 in six axes. Note that, instead of the integration controller 301, the coil controller 302 may be configured to perform the same process as the integration controller 301.

First, the mover position calculation function 401 calculates the number and the positions of the movers 101 on the stator 201, which forms a transport path, in accordance with the measured values from the plurality of linear encoders 204 and information on the attachment position thereof. Thereby, the mover position calculation function 401 updates mover position information (X) and number information in mover information 406 that is information on the mover 101. The mover position information (X) illustrates the position in the X direction that is the transport direction of the mover 101 on the stator 201. The mover information 406 is prepared for each mover 101 on the stator 201 as indicated as POS-1, POS-2, . . . in FIG. 6, for example.

Next, the mover attitude calculation function 402 determines the Y-sensor 205 and the Z-sensor 206 that can measure respective movers 101 from the mover position information (X) in the mover information 406 updated by the mover position calculation function 401. Next, the mover attitude calculation function 402 calculates attitude information (Y, Z, Wx, Wy, Wz) that is information on the attitude of each mover 101 based on the values output from the determined Y-sensor 205 and the determined Z-sensor 206 and updates the mover information 406. The mover information 406 updated by the mover attitude calculation function 402 includes the mover position information (X) and the attitude information (Y, Z, Wx, Wy, Wz).

Next, the mover attitude control function 403 calculates application force information 408 for each mover 101 from the current mover information 406 including the mover position information (X) and the attitude information (Y, Z, Wx, Wy, Wz) and an attitude target value. The application force information 408 is information related to the magnitude of force to be applied to each mover 101. The application force information 408 includes information related to three-axis components of force (Tx, Ty, Tz) and three-axis components of torque (Twx, Twy, Twz) of force T to be applied. The application force information 408 is prepared for each mover 101 on the stator 201 as indicated as TRQ-1, TRQ-2, . . . in FIG. 6, for example.

Herein, Tx, Ty, and Tz, which are three-axis components of force, are an X direction component, a Y direction component, and a Z direction component of force, respectively. Further, Twx, Twy, and Twz, which are three-axis components of torque, are a component around the X-axis, a component around the Y-axis, and a component around the Z-axis of torque, respectively. The transport system 1 according to the present embodiment controls transportation of the mover 101 while controlling the attitude of the mover 101 in six axes by controlling these six-axis components (Tx, Ty, Tz, Twx, Twy, Twz) of force T.

Next, the coil current calculation function 404 determines a current instruction value 409 applied to respective coils 202 based on the application force information 408 and the mover information 406.

In such a way, the integration controller 301 determines the current instruction value 409 by performing the process using the mover position calculation function 401, the mover attitude calculation function 402, the mover attitude control function 403, and the coil current calculation function 404. The integration controller 301 transmits the determined current instruction value 409 to the coil controller 302.

Figure 7:
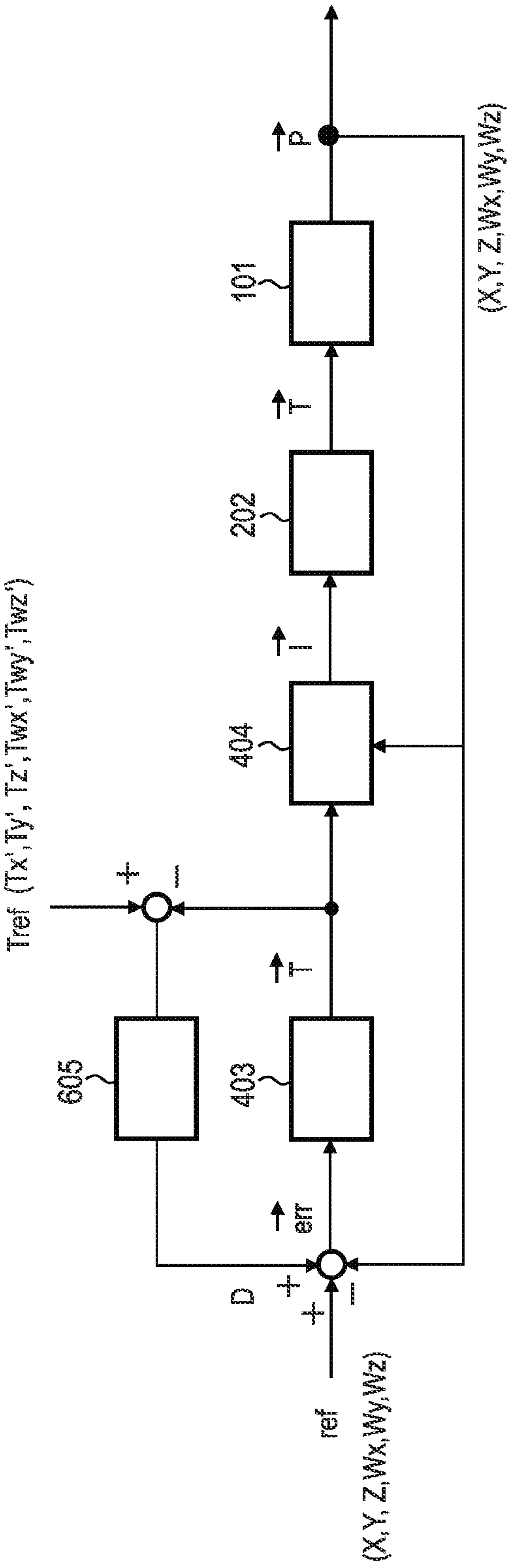
FIG. 7 is a schematic diagram illustrating an example of a control block for controlling the position and attitude of the mover in the transport system according to the first embodiment.

Control of the position and the attitude of the mover 101 will be further described in detail with reference to FIG. 7. FIG. 7 is a schematic diagram illustrating an example of a control block used for controlling the position and the attitude of the mover 101.

In FIG. 7, the symbol P denotes the position and the attitude of the mover 101 and has components (X, Y, Z, Wx, Wy, Wz). The symbol ref denotes a target value of (X, Y, Z, Wx, Wy, Wz). The symbol err denotes a deviation between the target value ref and the position and the attitude P.

The mover attitude control function 403 calculates force T to be applied to the mover 101 for achieving the target value ref based on the level of the deviation err, the change in the deviation err, an accumulation value of the deviation err, or the like. The coil current calculation function 404 calculates coil current I to be applied to the coils 202 for applying the force T to the mover 101 based on the force T to be applied and the position and the attitude P. The coil current I calculated in such a way is applied to the coils 202, and thereby the force T works on the mover 101, and the position and the attitude P changes to the target value ref.

The integration controller 301 can further control the force T applied to the mover 101 by performing a process using a force control function 605. The force control function 605 calculates an operation amount D to the target value ref from the difference between the force T applied to the mover 101 and a command value Tref of force. The command value Tref of force has components Tx', Ty', Tz', Twx', Twy', and Twz' with respect to the six axis components (Tx, Ty, Tz, Twx, Twy, Twz) of the force T. Tx' is a command value of Tx, Ty' is a command value of Ty, Tz' is a command value of Tz, Twx' is a command value of Twx, Twy' is a command value of Twy, and Twz' is a command value of Twz. The mover attitude control function 403 can calculate the force T to be applied to the mover 101 in consideration of the operation amount D. Herein, so-called zero power control can be performed by setting Tz', Twy', and Twz' to zero among the components of the command value Tref of the force. By the so-called zero power control, the mover 101 can be floated and controlled in a position and attitude where the gravitational force and the attraction force acting on the mover 101 are balanced.

By configuring the control block in such a way, it is possible to control the position and the attitude P of the mover 101 to a desired target value ref.

Next, a control method in which the mover 101 always moves upward even if power interruption occurs during the floating transport of the mover 101 in the transport system 1 will be described with reference to FIG. 8A to FIG. 12. The power interruption includes stopping of the application of current to the coil 202.

Figure 8A:
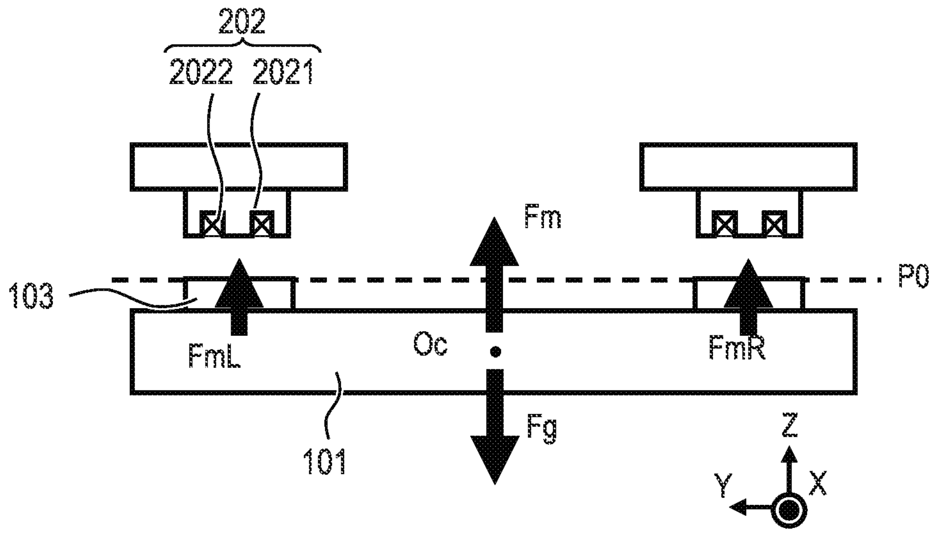
FIG. 8A is a schematic diagram illustrating a relationship between a Z direction force acting on the mover and the position of the mover in the Z direction.
Figure 8B:
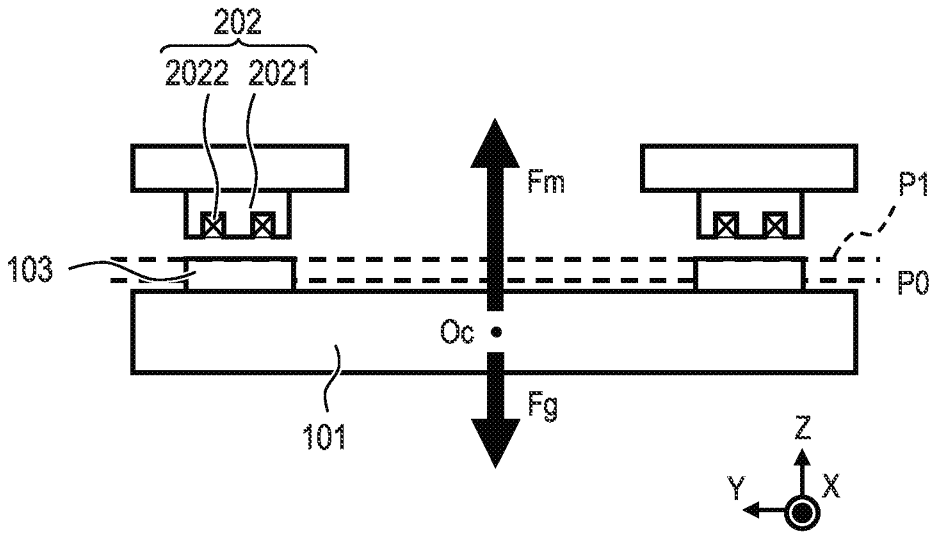
FIG. 8B is a schematic diagram illustrating a relationship between the Z direction force acting on the mover and the position of the mover in the Z direction.
Figure 8C:
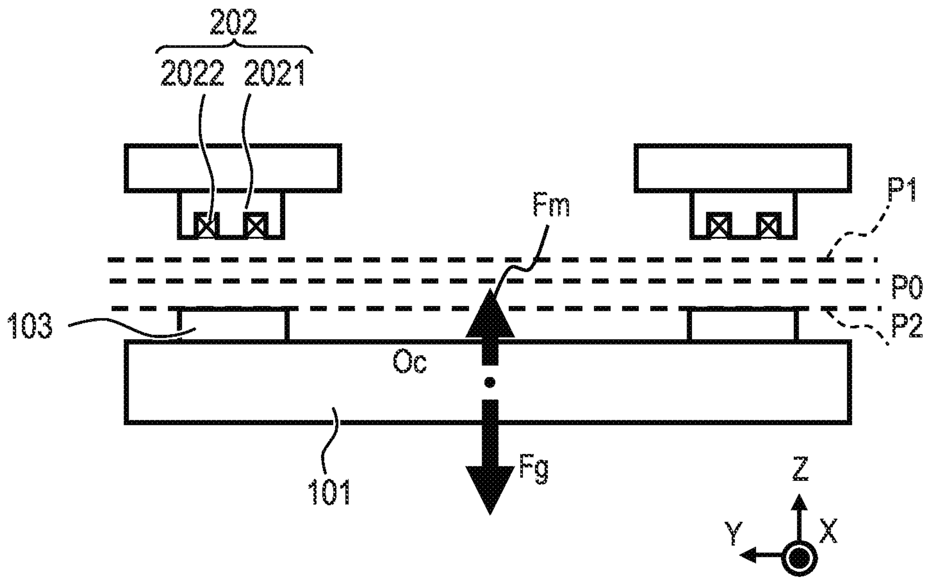
FIG. 8C is a schematic diagram illustrating the relationship between the Z direction force acting on the mover and the position of the mover in the Z direction.
Figure 8D:
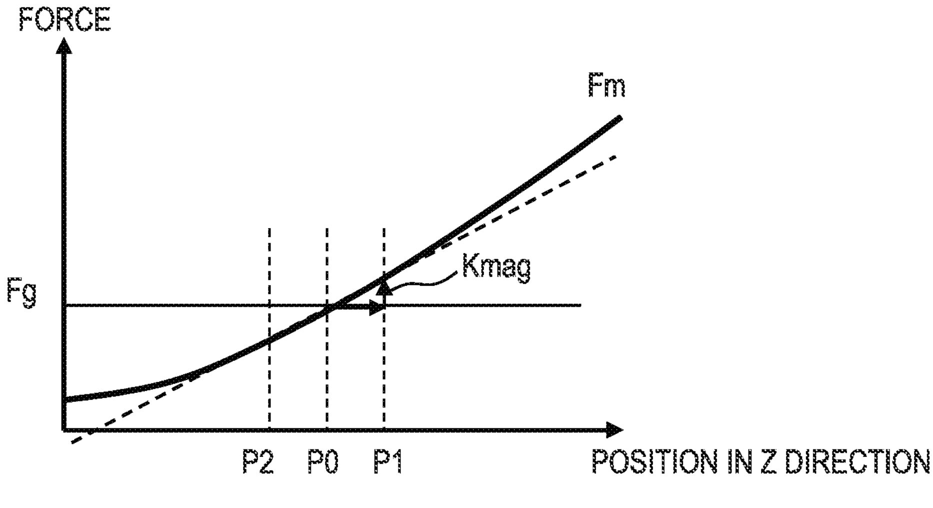
FIG. 8D is a graph illustrating the relationship between the Z direction force acting on the mover and the position of the mover in the Z direction.

First, an equilibrium position of the mover 101 in the transport system 1 will be described with reference to FIG. 8A to FIG. 8D. FIG. 8A to FIG. 8C are schematic diagrams illustrating relationships between the force acting on the mover 101 in the Z direction and the position of the mover 101 in the Z direction. FIG. 8A to FIG. 8C are views of the mover 101 and the coil 202 of the stator 201 viewed from the X direction. FIG. 8D is a graph illustrating the relationship between the force acting on the mover 101 in the Z direction and the position of the mover 101 in the Z direction.

FIG. 8A illustrates an equilibrium position P0, which is a position of the mover 101 in the Z direction where gravitational force Fg acting on the mover 101 and magnetic attraction force Fm acting on the mover 101 are balanced. In the mover 101, attraction force FmR, which is magnetic attraction force, acts between the permanent magnet 103 on the R side and the coil 202 facing the permanent magnet 103, and attraction force FmL, which is magnetic attraction force, acts between the permanent magnet 103 on the L side and the coil 202 facing the permanent magnet 103. The attraction force Fm is the resultant force of the attraction force FmR and the attraction force FmL. At the equilibrium position P0, the magnitude of the gravitational force Fg is equal to the magnitude of the attraction force Fm.

FIG. 8B illustrates a position P1 of the mover 101 in the Z direction having a smaller gap between the permanent magnet 103 and the coil 202 than the equilibrium position P0. At the position P1, the magnitude of the attraction force Fm is larger than the magnitude of the gravitational force Fg.

FIG. 8C illustrates a position P2 of the mover 101 in the Z direction having a gap between the permanent magnet 103 and the coil 202 larger than the equilibrium position P0. At the position P2, the magnitude of the attraction force Fm is smaller than the magnitude of the gravitational force Fg.

The graph of FIG. 8D illustrates the relationship between the force acting on the mover 101 in the Z direction and the position of the mover 101, with the horizontal axis being the position in the Z direction and the vertical axis being the force in the Z direction. On the horizontal axis, the gap between the permanent magnet 103 and the coil 202 is smaller on the right side. As illustrated in FIG. 8D, the gravitational force Fg remains constant even if the position in the Z direction expressed by the horizontal axis is changed, while the attraction force Fm is generally proportional to the inverse square of the distance between the permanent magnet 103 and the coil 202.

The mover 101 according to the present embodiment can move in an area where the above-described proportional relationship is sufficiently established. Therefore, the relationship between the position of the mover 101 in the Z direction and the attraction force Fm can be treated as an approximate straight line as shown by a dashed-dotted line in FIG. 8D. The slope of the approximate straight line indicating the ratio of the change of the attraction force Fm to the change of the position in the Z direction at this time is called the magnetic spring Kmag. The magnetic spring Kmag can be obtained from the relationship between the actual floating height of the mover 101 and the command value Tz' of the Z-direction component of the force T, or can be calculated in advance by a magnetic circuit simulation.

In the Wx direction, the position where the attraction force FmR on the R side and the attraction force FmL on the L side are balanced as illustrated in FIG. 8A is an equilibrium position. Similarly, in the Wy direction, the position where the attraction force head and behind the origin Oc, which is the center of gravity position of the mover 101, is balanced is the equilibrium position.

In order for the mover 101 to always move upward by the attraction force Fm even if the power interruption occurs during the floating transport, it is necessary to transport the mover 101 at a position Pz in the Z direction, which is a transport height in which the relationship where the magnitude of the attraction force Fm becomes larger than the magnitude of the gravitational force Fg is established, as illustrated in FIG. 8B. During the floating transport, the larger the difference between the position Pz and the equilibrium position P0, the more the coil current I required to maintain the position and attitude of the mover 101 increases, resulting in larger power consumption. On the other hand, if the difference between the position Pz and the equilibrium position P0 is too small, it becomes difficult to guarantee the upward movement of the mover 101 at the time of the power interruption due to the influence of a cogging torque described later.

Figure 9A:
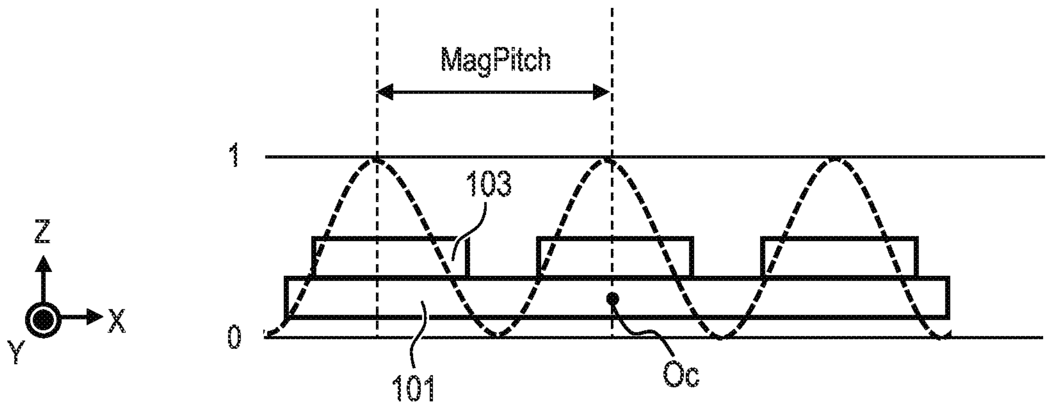
FIG. 9A is a schematic diagram illustrating an attraction force acting on the mover.

Next, the cogging torque applied to the mover 101 during the floating transport will be described with reference to FIG. 9A and FIG. 9B. As will be described later, the cogging torque includes force or torque that causes cogging in at least one direction of the Z direction, the Wy direction that is a rotational direction in which an axis along the Y axis is the rotational axis, and the Wz direction that is a rotational direction in which an axis along the Z axis is the rotational axis. FIG. 9A is a schematic view illustrating the attraction force acting on the mover 101, and is a view of the mover 101 viewed from the Y direction. In FIG. 9A, in order to simplify the description, the number of permanent magnets 103 installed in the mover 101 is set to three. In FIG. 9A, the dashed line schematically indicates the magnetic attraction force generated between the permanent magnet 103 and the coils 202 (not shown). In the X direction, the attraction force has a waveform having the same period as the arrangement period MagPitch of the permanent magnet 103. Herein, the upper limit value of the magnitude of the attraction force is set to 1, and the lower limit value is set to 0.

Figure 9B:
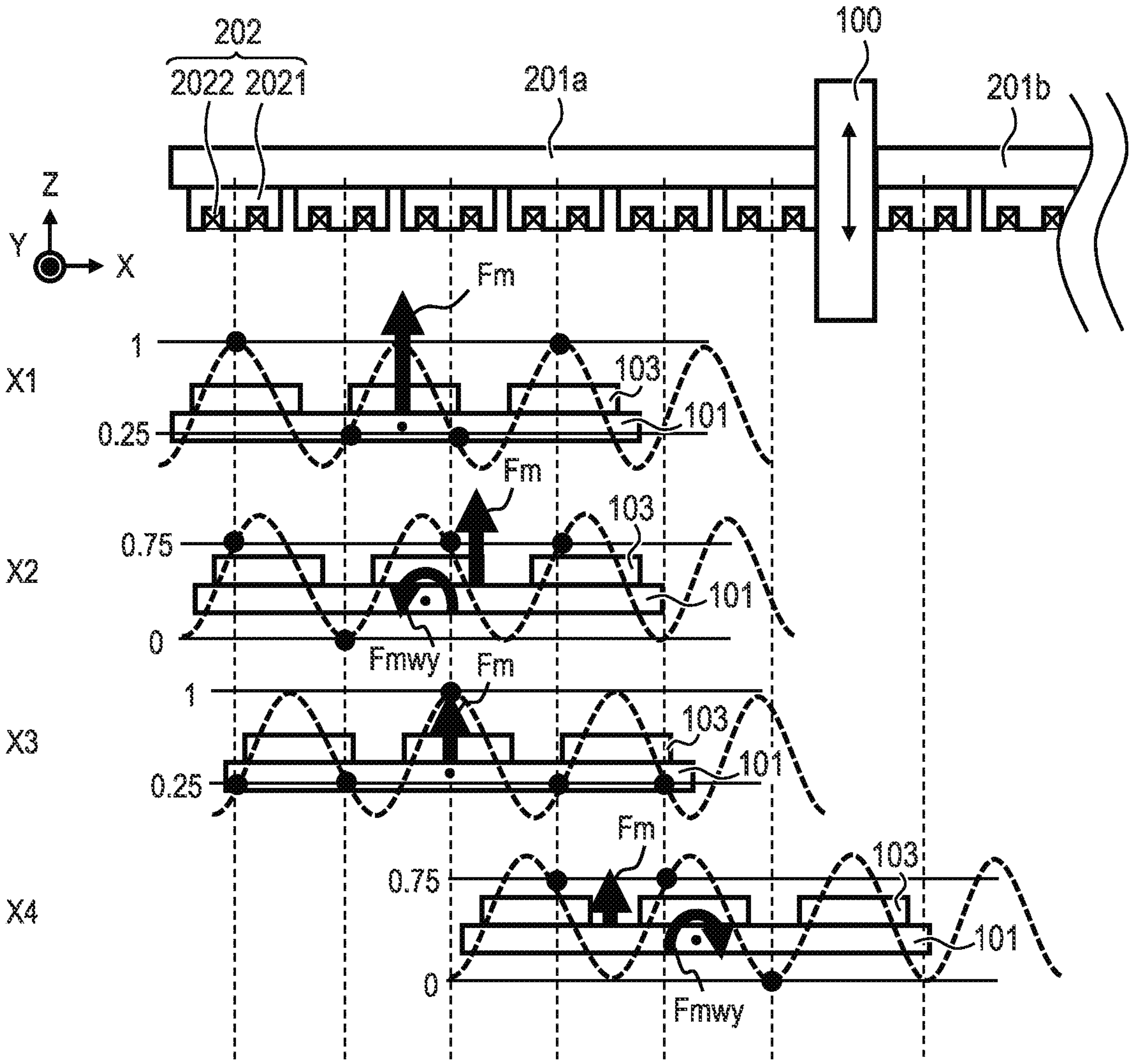
FIG. 9B is a diagram explaining a cogging torque acting on the mover.

FIG. 9B is an explanatory diagram for explaining the cogging torque applied to the mover 101 when the mover 101 illustrated in FIG. 9A is floated and transported from the position X1 to the position X4 in the X direction. FIG. 9B is a view of the coils 202 of the stators 201*a* and 201*b* viewed from the Y direction in addition to the mover 101. In FIG. 9B, the waveform of the attraction force, the upper limit value and the lower limit value are expressed in the same manner as in FIG. 9A. In FIG. 9B, the mover 101 in the state of the positions X1, X2, X3, and X4 is shifted in the Z direction for ease of explanation, but the case where the mover 101 is actually transported in the same Z direction is illustrated. In FIG. 9B, dashed-dotted lines along the Z direction indicate the center coordinates of the cores of the coils 202. Further, the coil 202 cannot be arranged at a place where a structure 100 such as a gate valve is arranged between the stator 201*a* and the stator 201*b*.

When the numbers of the coils 202 is 1 to N (N is an integer of 2 or more) and the attraction force of the i-th coil is Fi, the attraction force Fm acting on the mover 101 is Fm=ΣFi as the sum of Fi.

In FIG. 9B, the attraction force Fm at each of the positions X1, X2, X3, and X4 in the X direction is represented as Fm1, Fm2, Fm3, and Fm4, respectively, as follows.

$$Fm1=1+0.25+0.25+1=2.5 \quad X1:$$

$$Fm2=0.75+0.75+0.75=2.25 \quad X2:$$

$$Fm3=0.25+0.25+1+0.25+0.25=2.0 \quad X3:$$

$$Fm4=0.75+0.75+0=1.5 \quad X4:$$

As the mover 101 moves from the position X1 to the position X3, the attraction force Fm decreases. Further, at position X4, since the permanent magnet 103 enters in the area of the structure 100, the attraction force Fm is further reduced. This variation of the attraction force Fm is a cogging torque Fcz in the Z direction.

In the positions X2 and X4, since the attraction force Fm acts at a position deviated from the origin Oc that is the center of the mover 101, a moment Fmwy around the Y-axis is generated. The moment Fmwy becomes a cogging torque Fcwy in the Wy direction.

Although not shown, when the arrangement of the coils 202 or the permanent magnets 103 is different between in the R side and in the L side, a cogging torque Fcwx is also generated in the Wx direction with the same principle as in the Wy direction.

Figure 10:
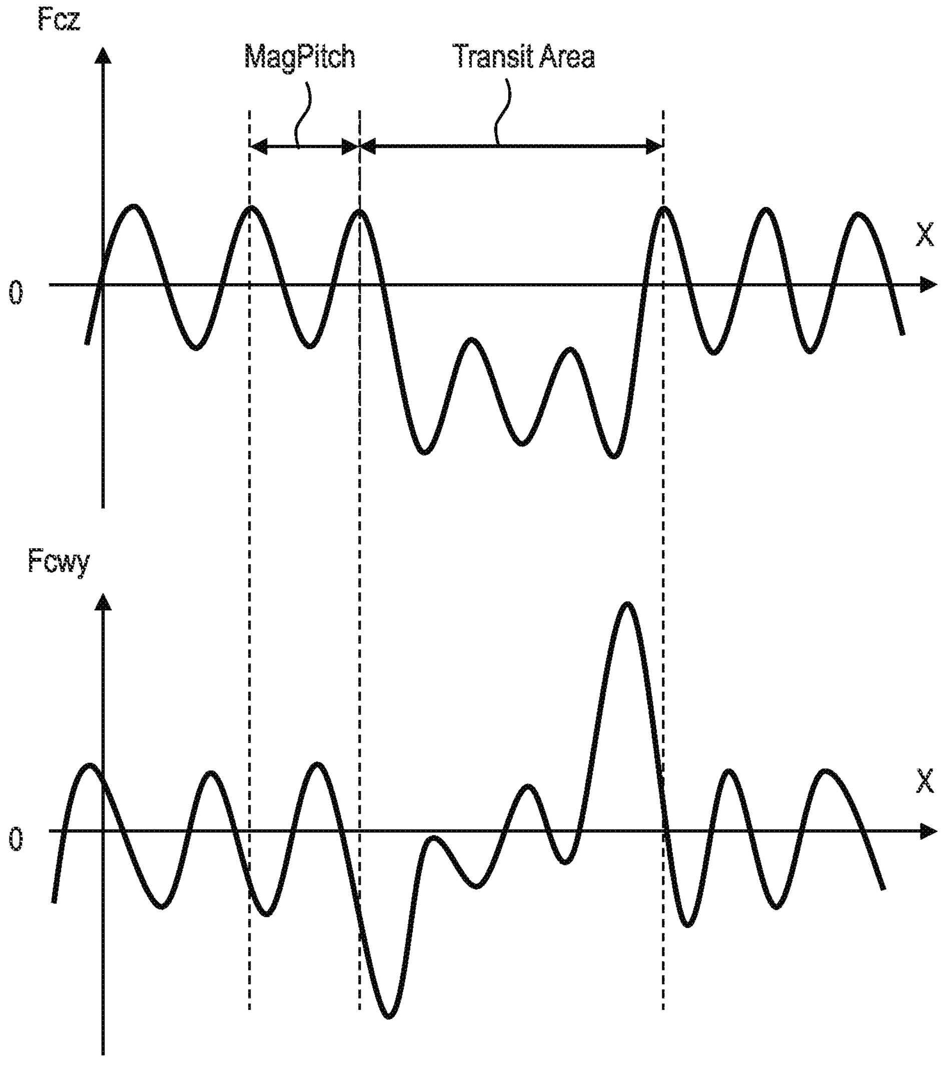
FIG. 10 is a graph illustrating the cogging torque in the Z direction and the cogging torque in the Wy direction.

FIG. 10 is a graph illustrating the cogging torque Fcz in the Z direction and the cogging torque Fcwy in the Wy direction. In the graphs illustrated in the upper and lower stages of FIG. 10, the horizontal axis of the upper and lower stages indicates the position of the mover 101 in the X direction, the vertical axis of the upper stage indicates the cogging torque Fcz in the Z direction, and the vertical axis of the lower stage indicates the cogging torque Fcwy in the Wy direction.

As illustrated in FIG. 10, in the X direction, the periods of the cogging torque Fcz and the cogging torque Fcwy are respectively determined by the arrangement period MagPitch of the permanent magnet 103. When there is a place where the coil 202 and the magnetic material cannot be arranged, such as a place where the structure 100 such as a gate valve exists, the larger cogging torques Fcz and Fcwy are generated in that place as compared with other places, as indicated by the transit area Transit Area. Note that, since the interval of the transit area Transit Area is the interval at which the mover 101 passes through the structure 100, the interval of the transit area Transit Area is the length of the mover 101 in the transport direction.

Next, a method of determining the transport height in consideration of the above-described equilibrium position P0 and the cogging torques Fcz, Fcwy, and Fcwx will be described with reference to FIG. 11A and FIG. 11B. The transport height is a height of the mover 101 in the Z direction when the mover 101 is moved in the X direction while being floated.

Figure 11A:
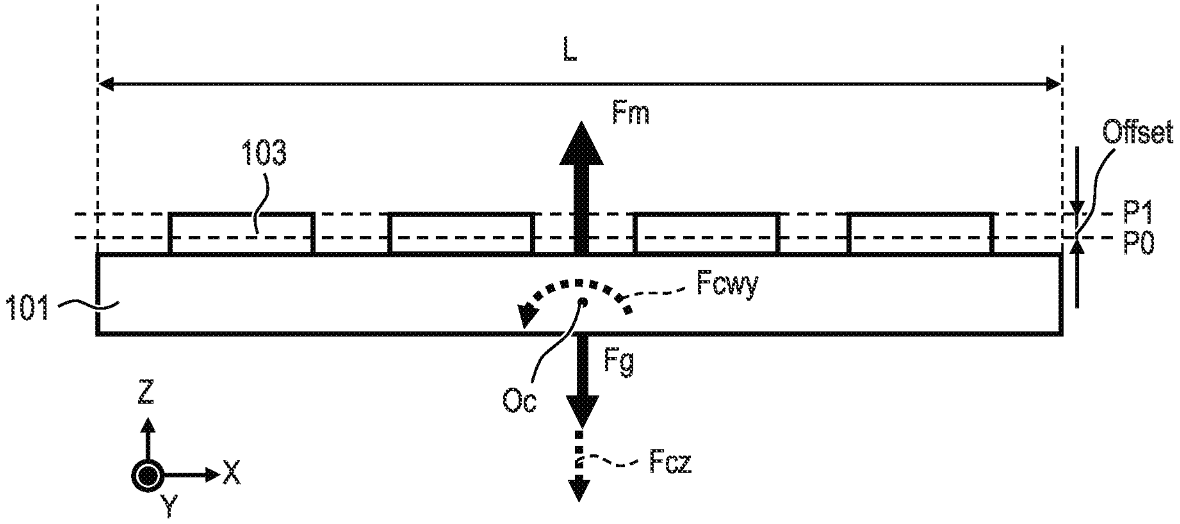
FIG. 11A is a side view illustrating a force acting on the mover located at a transport position with a transport height raised in the Z direction from an equilibrium position.
Figure 11B:
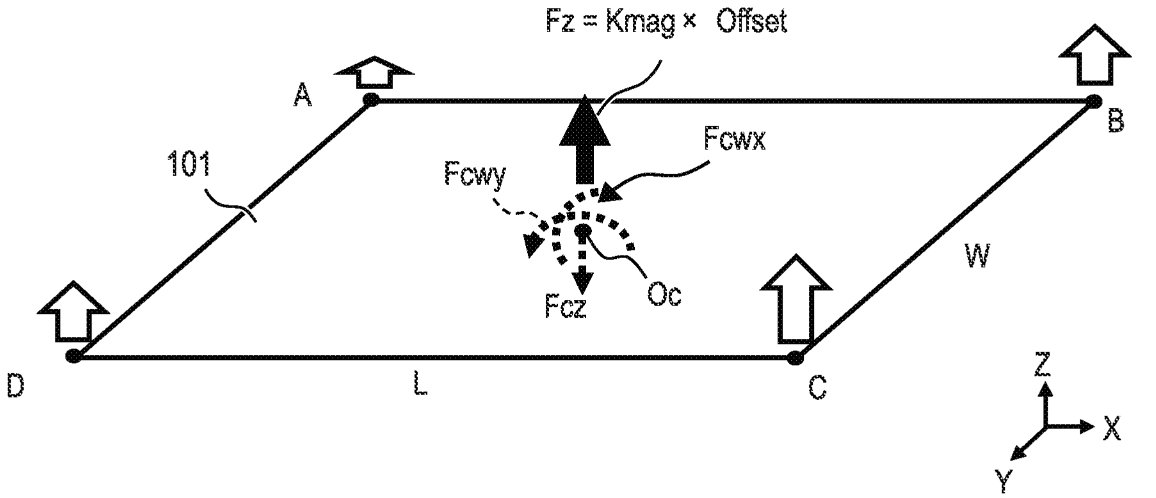
FIG. 11B is a perspective view illustrating a force acting on the mover located at the transport position with the transport height raised in the Z direction from the equilibrium position.

FIG. 11A and FIG. 11B are schematic diagrams illustrating the force applied to the mover 101 located at the transport position P1 where the transport height is increased by an offset amount in the Z direction from the equilibrium position P0. The transport position P1 is a height position of the mover 101 in the Z direction. FIG. 11A is a side view of the mover 101 viewed in the Y direction from a side face in the transport direction, and FIG. 11B is a perspective view of the mover 101 viewed from obliquely above.

First, as illustrated in FIG. 11A, the gravitational force Fg and the attraction force Fm indicated by the solid arrows in FIG. 11A act on the origin Oc, which is the center of gravity position of the mover 101. Herein, since the gap between the permanent magnet 103 and the coil 202 is smaller at the transport position P1 than the equilibrium position P0, the relation Fm>Fg is established. Since the magnitude of the attraction force Fm is proportional to the magnetic spring Kmag described above, the upward force Fz in the Z direction generated by the relationship between the attraction force Fm and the gravitational force Fg at this time is expressed by the following Expression (1) as shown in FIG. 11B.

$$Fz=K\text{mag}*\text{Offset} \quad \text{Expression (1)}$$

On the other hand, as illustrated in FIG. 11A and FIG. 11B, the cogging torque Fcz in the Z direction, the cogging torque Fcwy in the Wy direction, and the cogging torque Fcwx in the Wx direction indicated by the dashed arrows in FIG. 11A and FIG. 11B are applied to the mover 101. The magnitudes of these cogging torques are determined by the arrangement of the coils 202, the arrangement of the permanent magnets 103, and the mass of the mover 101. The magnitudes of these cogging torques are calculated by command value data of the force T applied to the mover 101 when the mover 101 is actually floated and transported, or calculated in advance by magnetic circuit simulation.

The condition for the mover 101 to always move upward in the Z direction is that the positions of the points A, B, C, and D in FIG. 11B must all be displaced upward. That is, the accelerations at the points A, B, C, and D may be upward in the Z direction. The points A, B, C, and D are the four vertices of the mover 101 approximating a rectangular planar shape with one pair of opposite sides parallel to the X direction.

Herein, the gravity acceleration is g [m/s$^2$], the mass of the mover 101 is M [kg], the length of the mover 101 in the X direction is L [m], and the width of the mover 101 in the Y direction is W [m]. Further, the moment of inertia around the X-axis acting on the mover 101 is Ix [kgm$^2$], and the moment of inertia around the Y-axis is Iy [kgm$^2$]. Then, the conditions for the accelerations at the points A, B, C and D to become upward in the Z direction are expressed by the following Expressions (2) to (5). Note that, since the magnitudes of the cogging torques Fcz, Fcwx, and Fcwy vary depending on the position X of the mover 101 in the X direction, each of them is a function of X. The unit of cogging torque Fcz is [N], and the units of the cogging torques Fcwx and Fcwy are [Nm].

$$\{(Fz/M+g)+(Fcz(X)/M)+(Fcwx(X)/Ix)*W/2+(Fcwy(X)/Iy)*L/2\}>0 \quad \text{Expression (2)}$$

$$\{(Fz/M+g)+(Fcz(X)/M)+(Fcwx(X)/Ix)*W/2-(Fcwy(X)/Iy)*L/2\}>0 \quad \text{Expression (3)}$$

$$\{(Fz/M+g)+(Fcz(X)/M)-(Fcwx(X)/Ix)*W/2-(Fcwy(X)/Iy)*L/2\}>0 \quad \text{Expression (4)}$$

$$\{(Fz/M+g)+(Fcz(X)/M)-(Fcwx(X)/Ix)*W/2+(Fcwy(X)/Iy)*L/2\}>0 \quad \text{Expression (5)}$$

By substituting Expression (1) for each of Expressions (2) to (5), Offset of the transport position P1 with respect to the equilibrium position P0 is solved, and the following Expressions (6) to (9) are derived.

$$\text{Offset}>-\{g+(Fcz(X)/M)+(Fcwx(X)/Ix)*W/2+(Fcwy(X)/Iy)*L/2\}*M/K\text{mag} \quad \text{Expression (6)}$$

$$\text{Offset}>-\{g+(Fcz(X)/M)+(Fcwx(X)/Ix)*W/2-(Fcwy(X)/Iy)*L/2\}*M/K\text{mag} \quad \text{Expression (7)}$$

$$\text{Offset}>-\{g+(Fcz(X)/M)-(Fcwx(X)/Ix)*W/2-(Fcwy(X)/Iy)*L/2\}*M/K\text{mag} \quad \text{Expression(8)}$$

$$\text{Offset}>-\{g+(Fcz(X)/M)-(Fcwx(X)/Ix)*W/2+(Fcwy(X)/Iy)*L/2\}*M/K\text{mag} \quad \text{Expression(9)}$$

According to Expressions (6) to (9), Offset can be determined based on the cogging torques Fcz, Fcwx, and Fcwy. By determining the offset amount Offset that can satisfy the conditions of Expressions (6) to (9) in all areas in the transport path constituted by the stator 201, the mover 101 always moves upward in the Z direction even when power is interrupted. That is, by setting Offset to a value greater than the maximum value of the right sides of Expressions (6) to (9) in all areas in the transport path, the mover 101 always moves upward in the Z direction even when power is interrupted.

Figure 12:
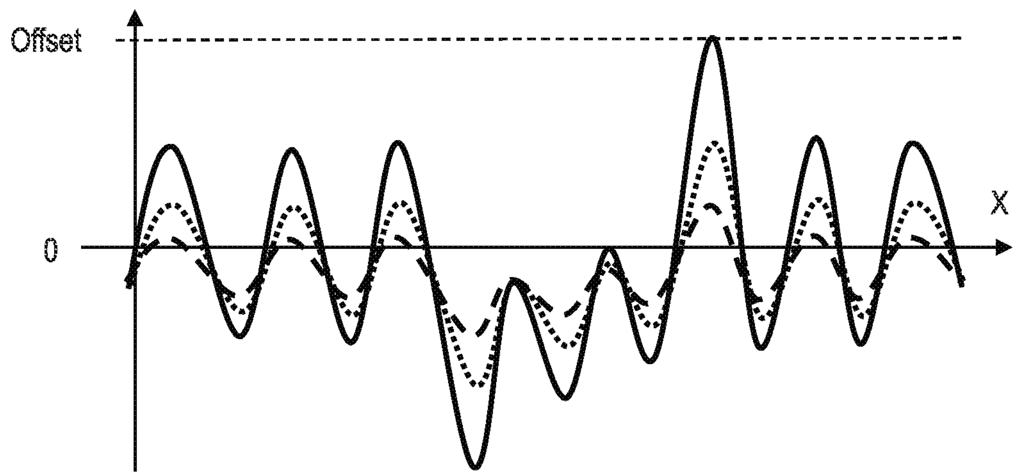
FIG. 12 is a graph illustrating a variation of a reference value for determining an offset amount in the Z direction of the transport position with respect to the equilibrium position.

FIG. 12 is a graph illustrating the variations of the values on the right sides of Expressions (6) to (9), which are reference values for determining the offset amount Offset in the Z direction of the transport position P1 with respect to the equilibrium position P0. In FIG. 12, the horizontal axis represents the position of the mover 101 in the X direction, and the vertical axis represents the values of the right sides of Expressions (6) to (9). In FIG. 12, the solid line is the value on the right side of Expression (6), the dashed lines are the values on the right sides of Expressions (7) and (9), and the dashed-dotted line is the value on the right side of Expression (8).

In the case illustrated in FIG. 12, among the values on the right sides of the Expressions (6) to (9), the value on the right side of the Expression (6) has the maximum value in all areas in the transport path. In this case, the offset amount Offset is determined to be greater than the maximum value of the value on the right side of the Expression (6). Note that which of the values on the right sides of Expressions (6) to (9) becomes the maximum value is determined by the relationship among the cogging torques Fcz(X), Fcwx(X) and Fcwy(X).

The transport position P1 is determined by adding the offset amount Offset calculated by the above method to the equilibrium position P0. The integration controller 301 determines, based on the cogging torques Fcz, Fcwx, and Fcwy, the transport position P1, which is a height position at which the mover 101 is floated when the mover 101 is transported. The integration controller 301 inputs the determined transport position P1 to the position Z in the Z direction in the target value ref illustrated in the block diagram of FIG. 7, and controls the floating transport of the mover 101 so that the mover 101 is positioned at the transport position P1.

Thus, the integration controller 301 moves the mover 101 in the X direction while floating the mover 101 in the Z direction at the transport position P1 higher than the equilibrium position where the magnetic attraction force acting between the plurality of permanent magnets 103 and the plurality of coils 202 and the gravitational force acting on the mover 101 are balanced. Thus, even if the power interruption occurs during the floating transport of the mover 101, the mover 101 can always be moved upward by the magnetic attraction force between the permanent magnet 103 and the coil 202, and fall of the mover 101 can be prevented. Note that the mover 101 moved upward stops with the stoppers 107 in contact with the upper collision prevention rollers 207.

For example, in an apparatus such as a vacuum film forming apparatus of an organic EL panel in which a substrate is transported by the mover 101 to an upper part of the pattern mask 501 on which a pixel pattern is formed to form a film, even if the power is interrupted due to some abnormality during the floating transport, the mover 101 can be prevented from falling. Thus, the collision of the mover 101 with the pattern mask 501 can be prevented, and the operation rate of the apparatus can be kept high.

Second Embodiment

A transport system according to a second embodiment of the present disclosure will be described. Note that the same components as those in the above first embodiment are labeled with the same references, and the description thereof will be omitted or simplified.

In the first embodiment described above, the method of controlling the floating transport of the mover 101 with the transport position P1 that is a transport height in consideration of the cogging torques acting on the mover 101, as the target value of the position in the Z direction has been described, but the present disclosure is not limited thereto. In the present embodiment, a method of controlling the floating transport of the mover 101 by using a command value of force in the Z direction instead of the transport position will be described.

First, Expressions (2) to (5) are solved for the force Fz in the Z direction to derive the following Expressions (10) to (13).

$$Fz>-\{g+(Fcz/M)+(Fcwx/Ix)*W/2+(Fcwy/Iy)*L/2\}*M \quad \text{Expression (10)}$$

$$Fz>-\{g+(Fcz/M)+(Fcwx/Ix)*W/2-(Fcwy/Iy)*L/2\}*M \quad \text{Expression (11)}$$

$$Fz>-\{g+(Fcz/M)-(Fcwx/Ix)*W/2-(Fcwy/Iy)*L/2\}*M \quad \text{Expression (12)}$$

$$Fz>-\{g+(Fcz/M)-(Fcwx/Ix)*W/2+(Fcwy/Iy)*L/2\}*M \quad \text{Expression (13)}$$

In the present embodiment, the force Fz in the Z direction is set to a value greater than the maximum value of the right sides of Expressions (10) to (13) in all areas in the transport path. Thus, even when the power is interrupted, the mover 101 always moves upward in the Z direction.

The integration controller 301 inputs the force Fz calculated by the above method to the command value Tz' (hereinafter, Tref(Z) is used as appropriate) of the force in the Z direction in the command value Tref of the force illustrated in the block diagram of FIG. 7, and controls the floating transport of the mover 101.

Thus, the integration controller 301 controls the currents flowing through the plurality of coils 202 so that the magnetic attraction force acting between the plurality of permanent magnets 103 and the plurality of coils 202 becomes greater than a predetermined value based on the cogging torques Fcz, Fcwx, and Fc. Thus, even if power interruption occurs during the floating transport of the mover 101, the mover 101 can always be moved upward by the magnetic attraction force between the permanent magnet 103 and the coil 202, and fall of the mover 101 can be prevented.

That is, in the present embodiment, the force control function 605 illustrated in FIG. 7 operates the target value ref so that the deviation between the force T applied to the mover 101 and the command value Tref of the force becomes zero. Therefore, by inputting −Fz to the command value Tref(Z) of the force, the position Z (hereinafter, ref(Z) is used as appropriate) at the target value ref is operated to the transport position P1 described in the first embodiment. As a result, the same effect as that of the first embodiment can be obtained in the present embodiment.

Third Embodiment

A transport system according to a third embodiment of the present disclosure will be described with reference to FIG. 13. Note that the same components as those in the above first and second embodiments are labeled with the same references, and the description thereof will be omitted or simplified.

In the first and second embodiments described above, ref(Z) in the target value ref and Tref(Z) in the command value Tref are input as fixed values. The target value ref(Z) and the command value Tref(Z) may be input as variable values that may differ depending on the position X of the mover 101 in the X direction. In particular, by inputting a variable value that can be different as the target value and the command value in the transit area Transit Area where the cogging torques greatly fluctuate and in other areas, it is possible to suppress power consumption during floating transport to be smaller than in the case of inputting a fixed value.

Figure 13:
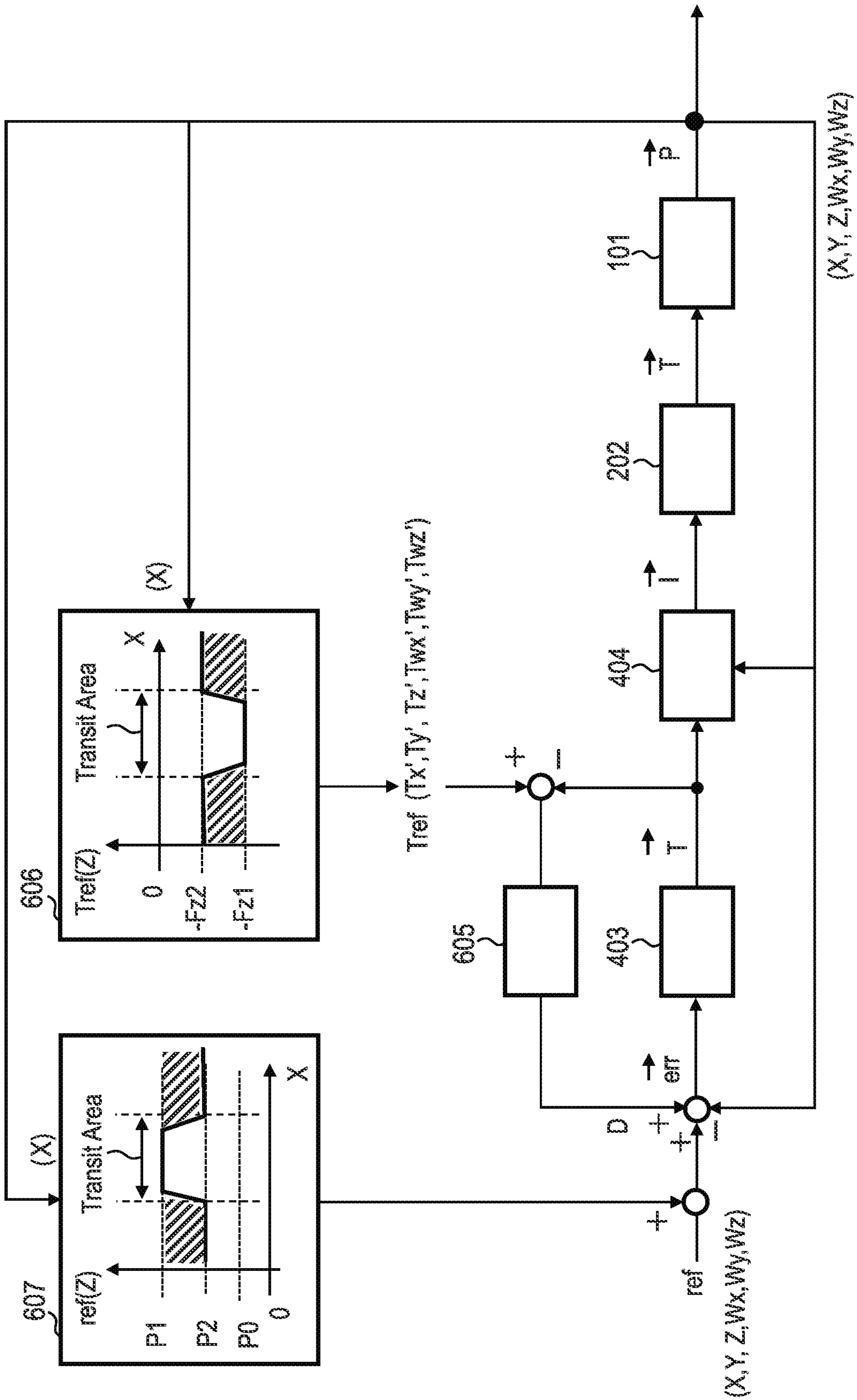
FIG. 13 is a schematic diagram illustrating an example of a control block for controlling the position and attitude of a mover in a transport system according to a third embodiment of the present disclosure.

FIG. 13 is a schematic diagram illustrating an example of a control block in a case where the target value ref(Z) and the command value Tref(Z) are input with different variable values depending on the position X of the mover 101. The integration controller 301 performs a process using a command value table function 606 and a target value table function 607.

The command value table function 606 calculates the command value Tref(Z) of the force in the Z direction corresponding to the position X of the mover 101 based on a command value table(Z) stored in advance in the storage device of the coil unit controller 303. The correspondence between the position X and the command value Tref(Z) of the force in the Z direction is recorded in the command value table(Z). Note that the command value table(Z) need not necessarily be stored in the storage device of the coil unit controller 303, but may be stored in the storage device of the integration controller 301, the storage device of an external device, or the like.

The target value table function 607 calculates the target value ref(Z) of the position in the Z direction corresponding to the position X of the mover 101 based on a target value table(Z) stored in advance in the storage device of the coil unit controller 303. The correspondence between the position X and the target value ref(Z) of the position in the Z direction is recorded in the target value table(Z). The target value table(Z) need not necessarily be stored in the storage device of the coil unit controller 303, but may be stored in the storage device of the integration controller 301, the storage device of an external device, or the like.

The command value table(Z) and the target value table(Z) stored in advance are determined from command value data of force when the mover 101 is actually floated and transported or from magnetic circuit simulation.

In the present embodiment, in the X direction, different values of the command value Tref(Z) and the target value ref(Z) are used for the transit area Transit Area and other areas, respectively. That is, as the command value Tref(Z), Fz1 in the transit area Transit Area and Fz2 in areas other than the transit area Transit Area are determined from the command value table(Z) and used. Fz1 and Fz2 have a magnitude relationship of Fz1>Fz2. As the target value ref(Z), P1 in the transit area Transit Area and P2 in areas other than the transit area Transit Area are determined from the target value table(Z) and used. P1 and P2 have a magnitude relationship of P1>P2.

Thus, in the present embodiment, the integration controller 301 can move the mover 101 in the X direction by changing the height position of the mover 101 according to the position of the mover 101 in the X direction.

Herein, Fz1 of the command value table(Z) used in the transit area Transit Area is equal to Fz of the command value Tref(Z) calculated in the second embodiment. In contrast, by changing the command value Tref(Z) to Fz2 smaller than Fz1 in the areas other than the transit area Transit Area, it is possible to suppress the force applied to the mover 101 to be smaller. As a result, compared with the method of inputting a fixed value as the command value Tref(Z) in the second embodiment, the effect of reducing power consumption corresponding to the shaded portion in FIG. 13 can be realized.

On the other hand, P1 of the target value table(Z) used in the transit area Transit Area is the same transport height as the transport position P1 calculated in the first embodiment. In contrast, by changing the target value ref(Z) to P2 smaller than P1 in the areas other than the transit area Transit Area, the mover 101 can be transported at a transport position where the difference from the equilibrium position P0 is small. As a result, compared with the method of inputting a fixed value as the target value ref(Z) in the first embodiment, the effect of reducing power consumption corresponding to the shaded portion in FIG. 13 can be realized.

Modification Embodiment

The present disclosure is not limited to the embodiments described above, and various modifications are possible.

For example, in the above embodiments, the transport system 1 is configured by a moving magnet type linear motor in which the permanent magnets 103 are disposed on the mover 101 and the coils 202 is disposed on the stator 201, but the present disclosure is not limited thereto. The transport system 1 may be configured by a moving coil type linear motor in which the permanent magnets 103 are disposed on the stator 201, which is a second member, and the coils 202 is disposed on the mover 101, which is a first member. In either case, the second member is movable in the X direction relative to the first member.

Further, the transport system according to the present disclosure can be used as a transport system that transports a workpiece together with a mover to an operation area of each process apparatus such as a machine tool that performs each operation process on the workpiece to be an article in a manufacturing system that manufactures an article such as an electronic device. In addition to the vapor deposition apparatus described above, the process apparatus that performs the operation process may be any apparatus such as an apparatus that performs assembly of a component to a workpiece, an apparatus that performs painting, or the like. Further, the article to be manufactured is not limited to a particular article and may be any component. In this way, the workpiece can be transported to an operation area by using the transport system according to the present disclosure, and an operation process is performed on the workpiece transported to the operation area to manufacture an article.

Embodiments of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiments and/or that includes one or more circuits (e.g., application specific integrated circuit (ASIC)) for performing the functions of one or more of the above-described embodiments, and by a method performed by the computer of the system or apparatus by, for example, reading out and executing the computer executable instructions from the storage medium to perform the functions of one or more of the above-described embodiments and/or controlling the one or more circuits to perform the functions of one or more of the above-described embodiments. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

According to the present disclosure, even when power is interrupted during the floating of the mover, the mover can be prevented from falling.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-087223, filed May 27, 2022, which is hereby incorporated by reference herein in its entirety.

What is claimed is:

1. A transport system comprising:

a mover;

a stator;

a plurality of magnets provided in one of the mover or the stator and arranged along a first direction;

a plurality of coils provided in one of the mover or the stator that does not have the plurality of magnets and arranged along the first direction so that the plurality of coils face the plurality of magnets; and a control unit that moves the mover in the first direction while floating the mover at a height position higher than an equilibrium position where magnetic attraction force acting between the plurality of magnets and the plurality of coils balances a gravitational force acting in a second direction crossing the first direction, wherein the mover has a stopper, wherein the stator has a collision-prevention roller that restricts a movable range of the mover in the second direction by contacting the stopper, wherein, when the stopper and the collision-prevention roller contact each other, the coil and the magnet are separated from each other, wherein the control unit determines the height position of the mover on which the gravitational force acts, based on a cogging torque, and wherein the control unit determines the height position of the mover based on, as the cogging torque, a cogging torque acting in a second direction parallel to the gravitational force, a cogging torque acting in a rotational direction with the first direction as an axis, and a cogging torque acting in a rotational direction with a third direction intersecting the first direction and the second direction as an axis.

2. The transport system according to claim 1,
wherein the control unit determines a current flowing through the coil so that the magnetic attraction force becomes greater than a predetermined value based on the cogging torque.

3. The transport system according to claim 2,
wherein the cogging torque includes a force or torque causing cogging in the second direction.

4. The transport system according to claim 3,
wherein the cogging torque includes a force or torque causing cogging in at least one direction of a first rotational direction having an axis along the second direction as a rotational axis and a second rotational direction having an axis along a third direction crossing the first direction and the second direction as a rotational axis.

5. The transport system according to claim 1,
wherein the control unit changes the height position of the mover, on which the gravitational force acts, according to a position in the first direction.

6. The transport system according to claim 1,
wherein the mover includes:
a bottom face positioned on an opposite side of the top face; and
a holding mechanism that is provided on the bottom face and configured to hold a workpiece.

7. The transport system according to claim 6,
wherein the workpiece includes a substrate.

8. The transport system according to claim 1,
wherein the coil has a core and a winding wound around the core.

9. A transport system comprising:
a mover;
a stator;
a plurality of magnets provided in one of the mover or the stator and arranged along a first direction;
a plurality of coils provided in one of the mover or the stator that does not have the plurality of magnets and arranged along the first direction so that the plurality of coils face the plurality of magnets; and
a control unit that determines a height position of the mover based on a cogging torque, and moves the mover in the first direction while floating the mover,
wherein the control unit determines the height position of the mover based on, as the cogging torque, a cogging torque acting in a second direction parallel to the gravitational force, a cogging torque acting in a rotational direction with the first direction as an axis, and a cogging torque acting in a rotational direction with a third direction intersecting the first direction and the second direction as an axis.

10. A film forming apparatus comprising:
the transport system according to claim 1 that transports a workpiece; and
a film deposition source configured to form a film on the workpiece and provided below the transport system.

11. A film forming apparatus comprising:
the transport system according to claim 9 that transports a workpiece; and
a film deposition source configured to form a film on the workpiece and provided below the transport system.

* * * * *